United States Patent
Thewes et al.

(10) Patent No.: US 6,717,843 B1
(45) Date of Patent: Apr. 6, 2004

(54) POLYVALENT, MAGNETORESISTIVE WRITE/READ MEMORY AND METHOD FOR WRITING AND READING A MEMORY OF THIS TYPE

(75) Inventors: Roland Thewes, Grobenzell (DE); Werner Weber, Munich (DE); Siegfried Schwarzl, Neubiberg (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/089,531

(22) PCT Filed: Sep. 21, 2000

(86) PCT No.: PCT/DE00/03293

§ 371 (c)(1),
(2), (4) Date: Jun. 4, 2002

(87) PCT Pub. No.: WO01/24190

PCT Pub. Date: Apr. 5, 2001

(30) Foreign Application Priority Data

Sep. 28, 1999 (DE) .......................................... 199 46 490

(51) Int. Cl.$^7$ .............................................. G11C 11/00
(52) U.S. Cl. .................... 365/158; 365/145; 365/173
(58) Field of Search ................................. 365/158, 145, 365/173, 171, 189.01

(56) References Cited

U.S. PATENT DOCUMENTS

| | | | |
|---|---|---|---|
| 5,585,986 A | 12/1996 | Parkin | |
| 5,734,605 A | 3/1998 | Zhu et al. | |
| 5,768,181 A | * 6/1998 | Zhu et al. | 365/158 |
| 5,864,498 A | 1/1999 | Womack | |
| 5,930,164 A | 7/1999 | Zhu | |
| 5,953,248 A | * 9/1999 | Chen et al. | 365/158 |

OTHER PUBLICATIONS

Jeong W—C et al: "A New Multilayered Structure for Multilevel Magnetoresistive Random Access Memory (MRAM) Cell" IEEE Transactions on Magnetics, US, ITEE Inc. New York, Bd 34. Nr. 4. Part 01 Jul. 1998, Seiten 1059–1071, XO000833048 ISSN: 0018–9464.

Ruili Zhang et al: "Demonstration of a four state sensing scheme for a single Pseudo–Spin Valve GMR bit" Digests of Intermag 99. 1999 IEEE International Magnetics Conference, Kyongju, South Korea, May 18–21, 1999, Bd 35, Nr. 5, pt. 1, Seiten 2829–2831, XP0002154844, IEEE Transactions on Magnetics, Sep. 1999, IEEE, USA, ISSN: 0018–9464.

* cited by examiner

*Primary Examiner*—David Lam
(74) *Attorney, Agent, or Firm*—Jeffrey R. Stone; Briggs and Morgan, PA

(57) ABSTRACT

A multivalue magnetoresistive read/write memory and method of writing to and reading from such a memory. The invention has, inter alia, one or more storage cells, each storage cell having two intersecting electric conductors and a layer system comprising magnetic layers located at the intersection of the electric conductors. The memory is characterized in that the layer system is designated as a multilayer system with two or more magnetic layers, wherein at least two of the magnetic layers have a magnetization direction that can be set independently of one another. Further, the magnetization direction of the individual layers may be changed on the basis of the electric current flowing through the electric conductors.

17 Claims, 2 Drawing Sheets a) 33: 0
34: 0 b) 33: 0
34: 1 c) 33: 1
34: 0 d) 33: 1
34: 1

POLYVALENT, MAGNETORESISTIVE WRITE/READ MEMORY AND METHOD FOR WRITING AND READING A MEMORY OF THIS TYPE

BACKGROUND OF THE INVENTION

The present invention relates firstly to a magnetoresistive read/write memory according to the preamble of patent claim 1. Furthermore, the invention relates to a method of writing to such a memory according to the preamble of patent claim 7 and to a method of reading from such a memory according to the preamble of patent claim 11.

DESCRIPTION OF THE RELATED PRIOR ART

Magnetoresistive read/write memories, which are referred to as MRAM memories (magnetoresistive random access memory), are memories in which data can be stored and also read again at one address. The memories generally have one or more storage cells, the storage effect residing in the magnetically variable electrical resistance of the storage cell or the storage cells.

Hitherto the development concerned using single-value storage cells, as they are known, with a binary storage content for the magnetoresistive memories. These storage cells comprise two intersecting electric conductors, which are preferably aligned at right angles to each other. At the intersection between these conductors, there is a layer system comprising two magnetic layers, one of the layers being formed from soft magnetic material and the other layer from hard magnetic material. Between the magnetic layers there is a tunnel oxide. Such a storage cell is described in the figure description in connection with FIG. 1. Depending on the state of magnetization, the magnetization directions in the magnetic layers can be aligned in parallel or antiparallel. Depending on the magnetization direction in the magnetic layers, the storage cell has a different electric resistance. In this case, a parallel magnetization direction leads to a lower electrical resistance of the storage cell, a defined item of information is written to the memory cell. Depending on whether the storage cell experiences a change in its information content in the process, a current or voltage pulse, or else the absence of such a pulse, can be detected on the corresponding read line. In this case, each read operation results in a loss of information from the cell. In order to compensate for this loss, the information read out is written back to the storage cell again after the read operation has been completed.

U.S. Pat. No. 5,734,605 discloses a single-value MRAM storage cell in which two or more magnetic layers are arranged between two electric conductors. Because of ferromagnetic coupling between the magnetic layers, their magnetization directions are always oriented in parallel with each other in the absence of a magnetic field. The information stored in the storage cell is encoded in the direction of the common orientation of the magnetic layers. In order to read the information, a possible change in the electrical resistance of the layers, based on the large magnetoresistive effect, is detected by a magnetic field which is sufficient to fold over the magnetization direction of a first magnetic layer but is not sufficient to fold over the magnetization direction of a second magnetic layer being applied.

With regard to the problem of the increased area requirement of single-value storage cells in order to achieve powerful memory systems, in recent times multivalue storage concepts have been developed, but have hitherto been proposed only for other types of memories than MRAMs. Such a memory type is, for example, an EEPROM (electrically erasable PROM), which may be written to and erased electrically. In this case, specific subregions of a basically continuous value range are set equal to discrete states. Assignments of this type cannot be performed in the MRAM storage cells, since no storage of continuously variable information is possible. This is because, on the basis of their principle, MRAM storage cells fundamentally constitute a system with a finite number of discrete states. The approaches to multivalency with regard to the aforementioned EEPROMs cannot therefore be transferred to the magnetoresistive memories.

Jeong et al. (Jeong, W C, Lee, B I, Joo, S K (1998) "A New Multilayered Structure for Multilevel Magnetoresistive Random Access Memory (MRAM) cell", IEEE Transactions on Magnetics, US, IEEE Inc., New York, Vol. 34, No. 4, Part 01, pp. 1069–1071) have shown, by using a layer sequence of magnetic nickel-iron, nickel-iron/cobalt and cobalt layers, in each case separated from one another by a copper intermediate layer and formed on a silicon copper double layer, that because of different coercivity field strengths of the three magnetic layers, the magnetization directions of the magnetic layers can be folded over individually by means of applying a tuneable magnetic field. This phenomenon was measured by using a respectively abrupt change in the resistance of the layer sequence, detected by means of a four-point measurement, resulting from the large magnetoresistive effect. Furthermore, Jeong et al. propose to set the individual magnetization directions of the magnetic layersin a sequence beginning with the magnetic layer with the highest magnetic hardness down as far as that magnetic layer with the lowest electric hardness.

Also known with regard to multivalue structures is U.S. Pat. No. 5,585,986, which discloses a digital magnetoresistive sensor for reading from a magnetic data storage system. This sensor has a multilayer structure, whose electrical resistance is measured. The multilayer structure comprises a number of ferromagnetic layers, the magnetic moments and therefore the magnetization directions of the individual layers being influenced by an external magnetic field, which is generated by the corresponding data carrier. magnetic field strengths. In this way, the resistance of the sensor changes in graduated steps when the external magnetic field is varied, which produces a digital output signal.

BRIEF SUMMARY OF THE INVENTION

On the basis of the aforementioned prior art, the intention is to provide a magnetoresistive read/write memory and a method of writing to and reading from such a memory in which the disadvantages and problems described in relation to the prior art are avoided. In particular, with regard to a possible saving of area, an improved MRAM memory and a suitable method of writing to and reading from such an MRAM memory are to be provided.

According to the first aspect of the invention, this object is achieved by a magnetoresistive read/write memory having one or more storage cells, each storage cell having two intersecting electric conductors and a layer system comprising magnetic layers located at the intersection of the electric conductors. According to the invention, the memory is characterized in that the layer system is designed as a multilayer system with two or more magnetic layers, in that at least two, but a maximum of all the magnetic layers have a magnetization direction that can be set independently of one another, and in that the magnetization direction in the individual layers is changed or can be changed on the basis of the electric current flowing through the electric conductors.

In this way, a multivalue memory having one or more multivalue storage cells and therefore with a correspondingly high storage capacity is created. Furthermore, this memory or the at least one storage cell can be written to and/or read from in a simple way.

A fundamental feature of the memory according to the invention or of the storage cell or storage cells forming the memory consists in using an n-layer multilayer system with n greater or equal to two magnetic layers at the intersection of the two electric conductors, it being possible for the magnetization direction in m layers, with n greater than or equal to m and M greater than or equal to two, to be set independently of the magnetization direction in the other layers. While in the case of the single-value memories the magnetization direction is set in only one magnetic layer, in the case of the multivalue memories according to the invention, this can now be carried out in any desired number of magnetic layers. In this case, the number of magnetic layers can vary depending on the requirement and application, so that the invention is not restricted to a specific number of layers. A similar multilayer system has in principle already been described in U.S. Pat. No. 5,585,986.

A further fundamental feature for the memory according to the invention is that the magnetization direction in the individual layers is changed or can be changed on the basis of the electric current flowing through the electric conductors.

In order to be able to set the magnetization directions in the individual magnetic layers independently of one another, it is necessary to achieve the situation where the setting of the magnetization direction (remagnetization) in the individual layers is brought about at respectively different field strengths or currents in the conductors.

In U.S. Pat. No. 5,585,986, this requirement is achieved by the multilayer system having a crystalline structure and by the individual layers having different crystalline symmetries and therefore magnetic anisotropies. Furthermore, the layers have a different thickness and layer morphology. If the multilayer system is exposed to a magnetic field with a respectively specific field strength, the magnetization direction in individual or several layers is either changed or not on the basis of the field strength of the magnetic field applied and the specific configuration of the respective layer. Because of the complex manufacturing operation for the multilayer system, such a system is particularly complicated and costly.

With the magnetoresistive memory according to the invention, a different route is followed. This route permits the manufacture of magnetic layers with substantially identical structures and morphologies. The respective, individual setting of the magnetization directions in the individual layers is brought about via respectively different field strengths by means of different current intensities. For this purpose, in each case an electric current flows through the two intersecting conductors, on the basis of which current a magnetic field is in each case formed around the two conductors The magnetic field acts on the individual magnetic layers of the multilayer system, as a result of which the latter can be remagnetized in the event of adequately high field strengths. The remagnetization of individual layers therefore depends on the magnitude of the currents flowing through the two conductors and the physical arrangement of the respective magnetic layer in relation to the electric conductors.

The intersecting conductors into which the current producing the field is impressed therefore function as a suitable read and/or write tool for the memory. While in the case of single-value memories, a fixed current is impressed into the conductors and either changes the magnetization direction in the remagnetizable magnetic layer or not, in connection with the present invention use is made of the fact that a change in the magnetic field strength is suitable to set the magnetization direction in a large number of magnetic layers independently of one another and individually. The provision of different magnetic field strengths can be carried out in various ways, as will be explained in more detail in the further course of the description.

Advantageous embodiments of the memory according to the invention emerge from the subclaims.

The magnetization directions that can be set independently of one another in the individual layers can preferably be set or can be capable of being set via different current intensities. This can be carried out in different ways, depending on the configuration of the storage cells. For example, it is conceivable for currents with different current intensities to be impressed into the electric conductors in order to set different magnetization directions in individual magnetic layers. As a result of the different current intensities, in each case different field strengths are produced, which then lead to a change in the magnetization direction in one or more layers or not.

In a further refinement, the electric conductors can be designed for high current densities.

The individual magnetic layers are preferably formed from a ferromagnetic material. However, the invention is not restricted to specific material types, so that other suitable materials are also possible.

The intersecting electric conductors can advantageously be aligned orthogonally to one another.

In a further refinement, in each case a tunnel dielectric is provided between two adjacent magnetic layers. The electronic conductivity through such a multilayer system comprising magnetic layers and tunnel dielectric layers lying between them is substantially determined by the tunnel effect through the tunnel dielectric. The selection of a suitable thickness for the tunnel dielectric is therefore of particular importance, since variations in the layer thickness lead to considerable variations in the conductivity, since the thickness of the layer enters approximately exponentially into the tunnel current. Preferably—but not exclusively— thin tunnel dielectric layers with a thickness from 2 to 3 nanometers (nm) are therefore used.

According to a second aspect of the present invention, a method of writing to a magnetoresistive read/write memory according to the invention as described above is provided which, according to the invention, is characterized by the following steps: a) impressing a variable electric current into the two electric conductors and, as a result, producing a magnetic field; and b) setting the magnetization direction in the individual magnetic layers of the multilayer system via the field strength of the magnetic field produced, the magnetization directions in the individual layer being set independently of one another via respectively differently high requisite field strengths, in such a way that the magnetization directions are set first in those layers which need the highest field strength for the purpose, and that the magnetization directions are then set in those layers which respectively need a lower field strength for the purpose.

As a result of the method according to the invention, it becomes possible in a simple way to write to a multivalue magnetoresistive memory or its storage cell or storage cells. According to the invention, the sequence in which the information is stored in the individual magnetic layers must be selected in such a way that the layers of a memory cell are written to in the sequence of decreasing field strength for the remagnetization of the layers (which means with programming current intensities respectively adapted in accordance with the field strength desired on the corresponding layer). This ensures that information that has already been written to the storage cell and has been written into a layer with a higher programming field strength is not overwritten again when information is written to further layers, which are then written to with respectively lower programming field strengths.

In relation to the advantages, reactions, effects and the functioning of the method according to the invention, reference is hereby also made further to the full disclosure of the above explanations relating to the memory according to the invention. Advantageous refinements of the method according to the invention emerge from the subclaims.

The different field strengths acting on the layers can preferably be produced by currents of different magnitudes being impressed into the conductors. The different field strengths acting on the layers are further determined by a different physical spacing of the layers in relation to the electric conductors.

Furthermore, it is also conceivable that, for setting the magnetization directions in the layers on the basis of field strengths of different magnitudes, is influenced by characteristics of the layer material and/or the layer thickness and/or the layer morphology.

Since the aforementioned examples have already been described extensively further above, reference is made at this point to the embodiments cited.

According to the third aspect of the present invention, a method of reading from a magnetoresistive read/write memory according to the invention as described above is provided which, according to the invention, is characterized by the following steps: a) impressing a defined item of data into the individual layers of the multilayer system in such a way that the item of data is first impressed into that layer which needs the lowest field strength to set the magnetization direction, and that the item of data is then impressed into the layers with the respectively next higher requisite field strength; and b) detecting a possible information change in the layer or the layers on the basis of the defined item of data impressed.

By means of the method according to the invention, a multivalue magnetoresistive memory can be read out in a simple way. In relation to the advantages, actions, effects and the functioning of the method according to the invention, in addition to the following description, reference is hereby made to the full disclosure of the above explanations relating to the memory according to the invention and to the method according to the invention for writing to a memory.

The basic idea of the method according to the invention for reading from a memory is that in each case a specific item of data, that is to say a specific item of information, is written successively to the individual magnetic layers of the storage cell or of the storage cells. If the information content of the layer changes following the impression of the specific item of data, this means that the layer had previously been written with a different item of information. If the information content of the layer does not change following the impression of the specific item of data, this means that the layer had previously also been written with the same item of information. In this case, it is of particular importance that the item of target data is known. The item of target data is to be understood to mean that item of data which, as described above, is specifically written to the storage cell.

The possible information change or the absence of an information change can be detected in a suitable way and then evaluated. Exemplary embodiments of this will be explained in more detail in the further course of the description.

In order to be able to carry out the action of reading from the storage cell or storage cells of the memory in an optimum way, first of all those layers are read, that is to say specifically rewritten with the specific item of data, which need the lowest programming field strength in order to set the magnetization direction. The specific item of data is therefore written to the storage cell or the individual layers of the multilayer system of the storage cell in the sequence of increasing programming field strength.

Advantageous embodiments of the method according to the invention emerge from the subclaims.

The possible information change in the layer or the layers can preferably be discovered by measuring the electrical resistance. Since the electrical resistance of the storage cell depends on the magnetization directions (parallel or antiparallel) of the individual layers, and the magnetization directions can change on the basis of possible information changes, a change in the electric resistance means that the information content of the storage cell or of individual layers of the memory cell has changed.

In addition, the possible information change in the layer or the layers can be carried out via detection of current and/or voltage pulses. If the action of writing the specific item of data to the layers of the storage line leads to an information change, a current and/or voltage pulse also occurs in the process, and can be detected. For the case in which no current and/or voltage pulse is detected, this means that no information change has taken place either in the layer or the layers.

The detection of a possible information change in the layer or the layers can preferably be carried out before and after the impression and/or during the impression of the specific item of data into the layer or the layers.

In an advantageous refinement, a specific item of data with respectively the same value can be impressed successively into all the layers. If information in binary form, that is to say with logic values "1" and "0", is stored in the storage cells, the specific item of data which is written successively to all the layers of the storage cell can have either the logic value "1" or "0".

In another refinement, it is also conceivable for an item of data which belongs to an alternating algorithm to be impressed successively into the layers.

The results during the detection of a possible information change for each layer can advantageously be stored intermediately, at least temporarily, in a suitable storage device.

BRIEF DESCRIPTION OF THE DRAWINGS

The invention will now be explained in more detail using exemplary embodiments and with reference to the appended drawing, in which:

FIG. 1b shows a schematic cross-sectional view of the storage cell according to FIG. 1a;

FIG. 1c shows an equivalent circuit for a storage cell according to FIG. 1a;

DETAILED DESCRIPTION OF THE INVENTION

Figure 1A:
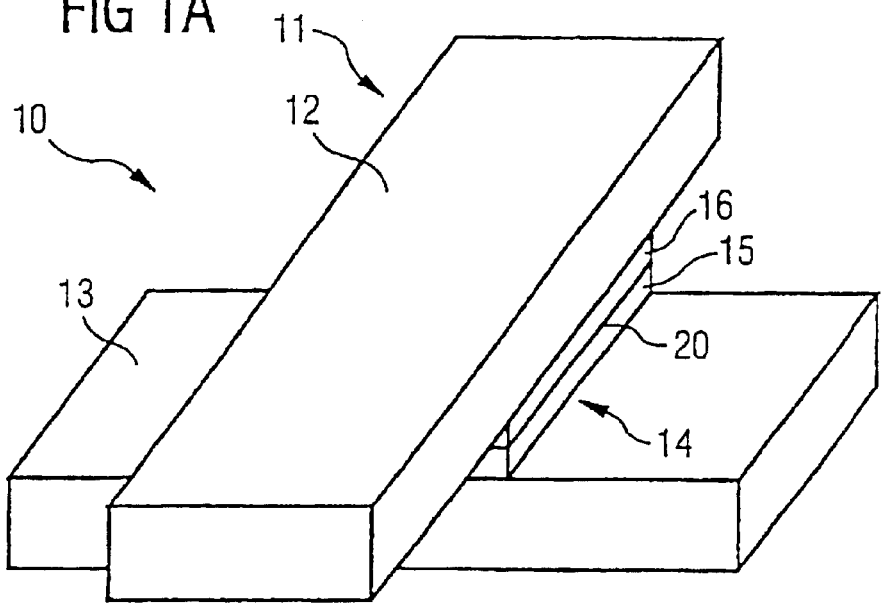
FIG. 1a shows a schematic perspective view of a magnetoresistive storage cell according to the prior art.
Figure 1B:
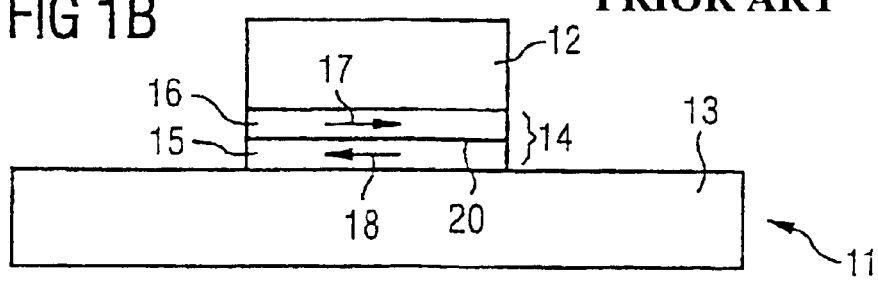
Figure 1C:
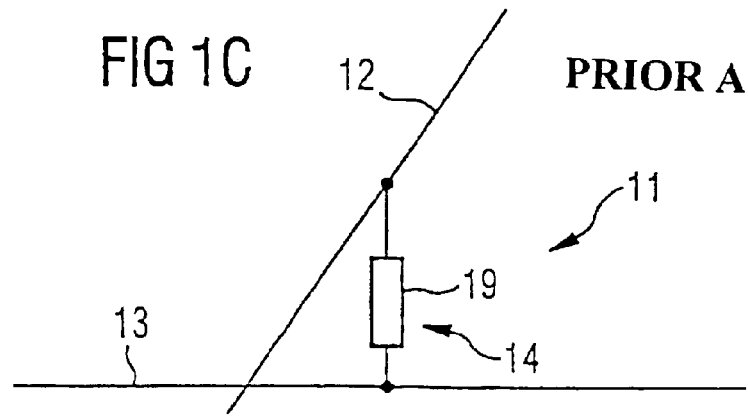

FIGS. 1a to 1c show a storage cell 11 of a magnetoresistive memory 10 according to the prior art. The storage cell 11 is designed as a single-value storage cell and has an upper 12 and a lower 13 electric conductor, which are aligned orthogonally to each other and intersect at an intersection of the storage cell 11. At the intersection there is a layer system 14 with two magnetic layers, a hard magnetic layer 15 and a soft magnetic layer 16. Between the layers 15, 16 there is a tunnel dielectric 20. For the storage cell 11, an equivalent circuit according to FIG. 1c can be specified, the value of the resistance 19 contained therein between the conductors 12, 13 depending on whether the magnetization directions 17, 18 in the magnetic layers 15, 16 are in parallel or antiparallel. The example according to FIG. 1b shows an antiparallel alignment of the magnetization directions. A parallel magnetization direction leads to a lower resistance value, while an antiparallel magnetization direction leads to a higher resistance value.

In order to write to the storage cell 11, high electric currents are impressed simultaneously into the conductors 12, 13. The magnetic field generated by these currents at the intersection of the conductors 12, 13 has an adequately high field strength there for the remagnetization of the soft magnetic layer 16.

The storage cell 11 and the memory 10 formed from one or more such storage cells 11 need a relatively large area.

In order to circumvent this disadvantage, a multivalue memory having multivalue storage cells is proposed. Two exemplary embodiments of such storage cells according to the invention are described in FIGS. 2 and 3.

Figure 2:
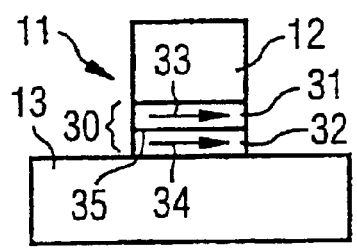
FIG. 2 shows a schematic cross-sectional view of a first embodiment of a multivalue memory cell according to the invention, a two-value memory cell here, different magnetization states being illustrated in the partial views a) to d)
Figure 2:
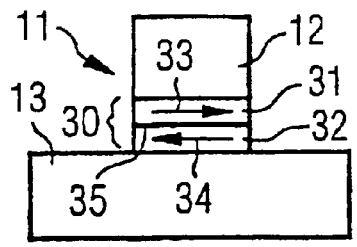
Figure 2:
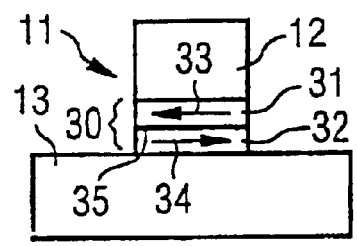
Figure 2:
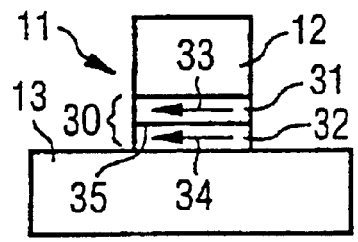

FIG. 2 shows in schematic form a two-layer 2-bit storage cell 11, as it is known. Between the two electric conductors 12, 13, at their intersection, there is a multilayer system 30 with a plurality of magnetic layers 31, 32 and tunnel dielectrics 35 in each case arranged between them.

In principle, the multilayer system has n magnetic layers, the condition $n \geq 2$ applying. Of these n layers, the magnetization direction can be set in m layers independently of the other adjacent layers, it being true that: $n \geq m \geq 2$.

In the exemplary embodiment according to FIG. 2, two magnetic layers 31, 32 are illustrated, whose magnetization directions 33, 34 can in each case be set independently of one another. The part views 2a to 2d of FIG. 2 in this case show the different possible magnetization states or magnetization directions 33, 34 in the magnetic layers 31, 32.

For the following explanation of the information content of the storage cell 11, the nomenclature introduced will be to name the magnetization directions with corresponding reference numbers, such as logic "0" and logic "1", the magnetization directions being described with increasing magnitude of the reference numbers for the magnetic layers counted from top to bottom. Logic "0" stands for the magnetization direction "from left to right" shown in FIGS. 2 and 3, logic "1" stands for the magnetization direction "from right to left" shown in FIGS. 2 and 3.

According to FIG. 2 and the part views shown therein, a total of four different magnetization states can be set in the magnetic layers 31, 32. According to FIG. 2a, in accordance with the nomenclature introduced above, a logic "0" applies to the set magnetization direction 33, while a logic "0" likewise applies to the magnetization direction 34. According to FIG. 2b, the result is 33="0" and 34="1". FIG. 2 shows the magnetization state 33="1" and 34="0", while FIG. 2d shows the magnetization state 33="1" and 34="1".

Figure 3:
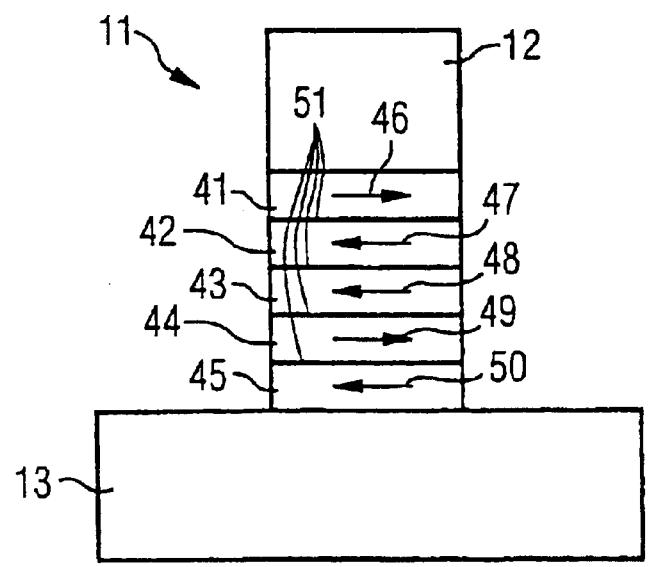
FIG. 3 shows a cross-sectional view of another embodiment of the multivalue storage cell according to the invention.

A further exemplary embodiment of a storage cell 11 is shown in FIG. 3. The storage cell 11 again has two intersecting electric conductors 12, 13 and a multilayer system 40 which is located at the intersection of the conductors 12, 13 and in the present case is formed of five magnetic layers 40–45, in which the respective magnetization directions 46–50 can in each case be set independently of adjacent layers. There is in each case a tunnel dielectric 51 between the magnetic layers.

According to the nomenclature introduced above, the storage cell 11 according to FIG. 3 has the following magnetization state: layer 41 has a magnetization direction 46 with logic "0", layer 42 has a magnetization direction 47 with logic "1", layer 43 has a magnetization direction 48 with logic "1", layer 44 has a magnetization direction 49 with logic "0" and layer 45 has a magnetization direction 50 with logic "1".

In order to be able to write specifically to the storage cells 11 explained above, the various magnetic layers 31, 32 or 41–45 must satisfy the requirement that different current intensities in the field-producing conductors 12, 13 are needed for their remagnetization. This can be achieved by respectively different magnetic field strengths being required in the individual layers. In this case, currents of different magnitudes can be impressed into the conductors 12, 13 and then produce the different field strengths for the remagnetization of the individual layers. At the same time, in order to provide field strengths of different magnitudes to set the magnetization directions in the individual layers, use is also made of the different physical spacing between the layer respectively to be remagnetized and the conductors 12, 13.

The sequence of storing the information in the individual layers 31, 32 or 41–45 of the storage cell 11 must be selected such that the layers of the storage cell are written to in the sequence of decreasing programming field strength. This means that first of all those layers which need the highest field strength to set the magnetization direction are written to first, while those layers which respectively need a lower field strength for this purpose are subsequently written to. This ensures that information that has already been written into the storage cell 11 and initially was written into a layer with a higher programming field strength cannot be overwritten again when information is being written into further layers.

For the reading procedure, according to the invention a method is specified which, for example, is based on the direct measurement of the resistance or on the detection of current and/or voltage pulses when a defined item of information is impressed into the corresponding bit of the storage cell 11 to be read.

The information content of the storage cells 11 is in principle changed during the complete read operation. However, no additional reference storage cell is needed.

The reading method will now be described by way of example using an m-bit cell, which is designed as a 2-bit cell. This cell has exactly m (with m=2) remagnetizable layers, each of which has a magnetization direction MRk, MRk describing the magnetization direction of the kth magnetic layer, counted from top to bottom, where $1 \leq k \leq m$. The storage cell contains the data Dk present in binary form, where $1 \leq k \leq m$. In order to read from this cell, a defined item of data Ek=Efix, where $1 \leq k \leq m$, is written to this cell in the sequence of increasing programming field strength (first of all, therefore, into those layers which need a low field strength in order to set the magnetization direction). For example, for all k, this item of data can have the logic value "0" or "1".

Before the start of this read operation, it is therefore true that MRk=Dk, and after it has been concluded, MRk=Efix, for all layers k with $1 \leq k \leq m$.

For the case in which a current and/or voltage pulse is detected during the kth write operation, this is a positive indicator that a change has taken place in the corresponding kth item of data, that is to say it is true that Dk=the item of data that is the complement of Efix. Before the defined item of data Efix was read into the layer, the latter therefore had stored the item of data that was the complement of Efix. For the case in which no current and/or voltage pulse is detected, it is true that Dk=Efix. Thus, after the read operation has been completed, the complete binary data from the storage cell is available.

As an alternative to the detection of a current and/or voltage pulse, a measurement of the electrical resistance in each case before and after the impression of the defined item of data Efix into the corresponding bit can also be performed for each write operation. In the case of an m-bit cell, a 2-bit cell in the present case, this means that a total of m+1 measurements, three measurements in the present case, have to be performed. The individual measured values for each layer are intermediately stored, at least temporarily, in a suitable storage device. For the case in which, during the measurements relating to the kth bit, the resistance values before and after the impression of the item of data Efix are different, it is true that Dk before the impression of the item of data Efix was originally the item of data that is the complement of Efix. In the case of identical resistance values before and after the impression of the item of data Efix, the result is Dk=Efix.

The reading method cited above was used to read out 2-bit cells. However, similar methods are also possible for m-bit cells with m>2.

What is claimed is:

1. A magnetoresistive read/write memory, with a plurality of multivalue storage cells, each storage cell having two intersecting electric conductors and a layer system comprising magnetic layers located at the intersection of said electric conductors, wherein said layer system is designed as a multilayer system with two or more magnetic layers, at least two, but a maximum of all said magnetic layers having a magnetization direction in that can be set independently of one another, said magnetization direction in an individual layer of said magnetic layers being changed by the electric current flowing through said electric conductors, and further comprising in each case a tunnel dielectric between each two magnetic layers that are next to each other, and wherein said two or more magnetic layers of the multivalue storage cell are sandwiched between said two intersecting electric conductors.

2. The magnetoresistive read/write memory as claimed in claim 1, in which said magnetization directions that can be set independently of one another in said individual layers can be set via different current intensities.

3. The magnetoresistive read/write memory as claimed in claim 1, in which said electric conductors are designed for high current densities.

4. The magnetoresistive read/write memory as claimed in claim 1, in which said magnetic layers are formed from a ferromagnetic material.

5. The magnetoresistive read/write memory as claimed in claim 1, in which said intersecting conductors are aligned orthogonally to one another.

6. The magnetoresistive read/write memory as claimed in claim 1, in which said tunnel dielectric has a thickness of 2 to 3 nm.

7. A method of writing to a magnetoresistive read/write memory, the magnetoresistive read/write memory comprising a plurality of multivalue storage cells, each storage cell having two intersecting electric conductors and a layer system comprising magnetic layers located at the intersection of said electric conductors, wherein said layer system is designed as a multilayer system with two or more magnetic layers, at least two, but a maximum of all said magnetic layers having a magnetization direction in that can be set independently of one another, said magnetization direction in an individual layer of said magnetic layers being changed by the electric current flowing through said electric conductors, and further comprising in each case a tunnel dielectric between each two magnetic layers that are next to each other, and wherein said two or more magnetic layers of the multivalue storage cell are sandwiched between said two intersecting electric conductors, the method comprising:

a) impressing a variable electric current into said two electric conductors and, as a result, producing a magnetic field; and b) setting said magnetization direction in said individual magnetic layers of said multilayer system via the field strength of said magnetic field produced, said magnetization directions in said individual layers being set independently of one another via respectively differently high requisite field strengths, in such a way that said magnetization directions are set first in those layers which need the highest field strength for this purpose and that said magnetization directions are then set in those layers which respectively need a lower field strength for this purpose.

8. The method as claimed in claim 7, in which said different field strengths acting on said layers are produced by currents of different magnitudes being impressed into said conductors.

9. The method as claimed in claim 7, in which said different field strengths acting on said layers are produced by means of a different physical spacing of said layers in relation to said conductors.

10. The method as claimed in claim 7, in which the setting of said magnetization directions in said layers on the basis of field strengths of different magnitudes are influenced by the layer material and/or the layer thickness and/or the layer morphology.

11. A method of writing to a magnetoresistive read/write memory, the magnetoresistive read/write memory comprising a plurality of multivalue storage cells, each storage cell having two intersecting electric conductors and a layer system comprising magnetic layers located at the intersection of said electric conductors, wherein said layer system is designed as a multilayer system with two or more magnetic layers, at least two, but a maximum of all said magnetic layers having a magnetization direction in that can be set independently of one another, said magnetization direction in an individual layer of said magnetic layers being changed by the electric current flowing through said electric conductors, and further comprising in each case a tunnel dielectric between each two magnetic layers that are next to each other, and wherein said two or more magnetic layers of the multivalue storage cell are sandwiched between said two intersecting electric conductors, the method comprising:

a) impressing a defined item of data into said individual layers of said multilayer system in such a way that the item of data is first impressed into that layer which needs the lowest field strength to set said magnetization direction, and that the item of data is then impressed into said layers having the respectively next higher requisite field strength; and b) detecting a possible information change in said layer or said layers on the basis of said impressed defined item of data.

12. The method as claimed in claim 11, in which the detection of a possible information change in said layer or said layers is carried out by measuring the electrical resistance.

13. The method as claimed in claim 11, in which the detection of a possible information change in said layer or said layers is carried out via detection of current and/or voltage pulses.

14. The method as claimed in claim 11, in which the detection of a possible information change in said layer or said layers is carried out before and after said impression and/or during said impression of said specific item of data into said layer or said layers.

15. The method as claimed in claim 11, in which said item of data with respectively the same value is successively impressed into all said layers.

16. The method as claimed in claim 11, in which said item of data which belongs to an alternating algorithm is impressed successively into said layers.

17. The method as claimed in claim 11, in which the results during said detection of a possible information change for each layer are intermediately stored, at least temporarily, in a storage device.

* * * * *